US012701926B2

(12) United States Patent
van der Straten et al.

(10) Patent No.: US 12,701,926 B2
(45) Date of Patent: Aug. 4, 2026

(54) CHAMFERED MRAM DEVICE STRUCTURE

(71) Applicant: INTERNATIONAL BUSINESS MACHINES CORPORATION, Armonk, NY (US)

(72) Inventors: Oscar van der Straten, Guilderland Center, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 725 days.

(21) Appl. No.: 18/046,172

(22) Filed: Oct. 13, 2022

(65) Prior Publication Data

US 2024/0130244 A1 Apr. 18, 2024

(51) Int. Cl.
| | |
|---|---|
| *H10N 50/80* | (2023.01) |
| *H10B 61/00* | (2023.01) |
| *H10N 50/01* | (2023.01) |

(52) U.S. Cl.
CPC ............. *H10N 50/80* (2023.02); *H10B 61/00* (2023.02); *H10N 50/01* (2023.02)

(58) Field of Classification Search
CPC ........ H10N 50/80; H10N 50/01; H10N 50/10; H10B 61/00
See application file for complete search history.

(56) References Cited

U.S. PATENT DOCUMENTS

| | | | |
|---|---|---|---|
| 8,455,965 | B2 | 6/2013 | Li |
| 8,644,063 | B2 | 2/2014 | Li |
| 9,564,577 | B1 * | 2/2017 | Hsu .......................... H10N 50/10 |
| 9,847,477 | B2 | 12/2017 | Huang |
| 10,319,783 | B2 * | 6/2019 | Briggs ................... H10N 50/01 |
| 11,004,897 | B2 | 5/2021 | Li |
| 11,107,980 | B2 | 8/2021 | Wu |
| 11,165,016 | B2 | 11/2021 | Sonoda |
| 2007/0109853 | A1 * | 5/2007 | Ho ....................... G11C 11/1659 365/185.05 |
| 2010/0258887 | A1 * | 10/2010 | Zhu ..................... H01F 10/3272 257/E29.323 |
| 2015/0056722 | A1 | 2/2015 | Li |
| 2017/0294576 | A1 * | 10/2017 | Huang ................... H10N 50/10 |
| 2017/0338407 | A1 * | 11/2017 | Gaidis ................... H10N 50/01 |
| 2018/0261270 | A1 * | 9/2018 | Yoshikawa ............ H10N 50/80 |
| 2020/0020848 | A1 * | 1/2020 | Chuang .................. H10N 50/10 |
| 2021/0193910 | A1 * | 6/2021 | Jabeur ................... H10N 50/85 |

(Continued)

*Primary Examiner* — William B Partridge

*Assistant Examiner* — Erik A. Anderson

(74) *Attorney, Agent, or Firm* — Yuanmin Cai

(57) ABSTRACT

Embodiments of present invention provide a method of forming a MRAM structure. The method includes forming a blanket first ferromagnetic layer on top of a bottom electrode; etching the blanket first ferromagnetic layer to form a first ferromagnetic layer, the first ferromagnetic layer having an upper portion that has an angled edge and a lower portion that has a vertical edge; forming a blanket tunnel barrier layer on top of the first ferromagnetic layer and a blanket second ferromagnetic layer on top of the blanket tunnel barrier layer; patterning the blanket tunnel barrier layer and the blanket second ferromagnetic layer to form a tunnel barrier layer and a second ferromagnetic layer; and forming a top electrode on top of the second ferromagnetic layer. A MRAM structure formed thereby is also provided.

11 Claims, 13 Drawing Sheets

(56)          References Cited

U.S. PATENT DOCUMENTS

| | | | | |
|---|---|---|---|---|
| 2021/0305508 A1* | 9/2021 | Lee | .................... | H10N 70/8828 |
| 2022/0115583 A1 | 4/2022 | Wang | | |
| 2022/0165936 A1 | 5/2022 | Shen | | |
| 2022/0393101 A1* | 12/2022 | Lee | ........................ | H10N 50/01 |
| 2023/0371275 A1* | 11/2023 | Wang | .................... | H10N 50/85 |

* cited by examiner

CHAMFERED MRAM DEVICE STRUCTURE

BACKGROUND

The present application relates to manufacturing of semiconductor integrated circuits. More particularly, it relates to method of forming a magnetoresistive random-access memory and the structure formed thereby.

With the explosion of digital information, semiconductor memory devices are playing an ever increasingly important role in the managing and organizing of this digital information through storing, retrieving, and/or transformation of this digital information. Magnetoresistive random-access memory (MRAM) is a type of non-volatile memory (NVM) capable of holding saved data even in the event that power to the memory device is down or is accidentally cut off. There have been several recent developments in the technology that allow MRAM to be used successfully in specific emerging applications, as well as in not-so-new ones.

MRAM technology is based on a component known as magnetic tunnel junction (MTJ) that consists of two ferromagnetic layers separated by an insulating layer known as a tunnel barrier layer. In a vertical MRAM device, a top and a bottom electrode compliment the MTJ to form a vertical MTJ stack. The vertical MTJ stack is usually formed by a subtractive patterning of a stack of blanket layers corresponding to the MTJ stack. The subtractive patterning transforms the stack of blanket layers into multiple pillars that correspond to multiple MTJ stacks. After the MTJ stack patterning, the inter-pillar spaces are generally filled with an interlevel-dielectric (ILD) layer to enable connection to the back-end-of-line (BEOL) wiring such as a top metal level that may serve as a top contact.

With the seemingly never-ending scaling of semiconductor devices and the resulting reduced pitches between the MTJ stacks or pillars, it has become increasingly challenging to fill the gaps between the MTJ stacks or pillars using ILD materials. More specifically, due to the height of the MTJ stacks which generally corresponds to a height between two neighboring metal levels of a BEOL structure, when being compared with the reduced pitch between two neighboring MTJ stacks or pillars, the situation becomes that the IDL material may need to fill an opening or space that has a very high aspect ratio. It has been known that during the ILD gap-filling process, voids may form within the IDL layer between the MTJ stacks or pillars. The voids may ultimately lead to short among the MTJ devices when the voids are accidentally filled with conductive materials.

SUMMARY

Embodiments of present invention provide a MRAM structure. The MRAM structure includes a magnetic tunnel junction (MTJ) stack, the MTJ stack including, vertically from a bottom to a top thereof, a bottom electrode, a first ferromagnetic layer, a tunnel barrier layer, a second ferromagnetic layer, and a top electrode, wherein at least one of the first ferromagnetic layer and the second ferromagnetic layer has a chamfered edge.

In one embodiment, the first ferromagnetic layer has the chamfered edge, and a bottom surface of the second ferromagnetic layer is larger than a top surface of the first ferromagnetic layer.

In another embodiment, the first ferromagnetic layer has a vertical edge, and the chamfered edge intersects with the vertical edge.

In yet another embodiment, the chamfered edge forms an angle, between about 120 degrees and about 150 degrees, with a top surface of the first ferromagnetic layer.

In one embodiment, both the first ferromagnetic layer and the second ferromagnetic layer have chamfered edges.

In another embodiment, the first ferromagnetic layer is a reference layer and the second ferromagnetic layer is a free layer.

In yet another embodiment, the MTJ stack is a first MTJ stack, and the MRAM structure further includes a second MTJ stack, and wherein the first and second MTJ stacks have a height of about 260 nm and are separated by a distance less than about 80 nm.

Embodiments of present invention also provide a method of forming a MRAM structure. The method includes forming a bottom electrode in a first dielectric layer; forming a blanket first ferromagnetic layer on top of the bottom electrode; etching a first portion of the blanket first ferromagnetic layer to form an upper portion of a first ferromagnetic layer, the upper portion of the first ferromagnetic layer having an angled edge; etching a second portion of the blanket first ferromagnetic layer to form a lower portion of the first ferromagnetic layer, the lower portion of the first ferromagnetic layer having a vertical edge; surrounding the angled edge and the vertical edge of the first ferromagnetic layer with a second dielectric layer; forming a blanket tunnel barrier layer on top of the first ferromagnetic layer and a blanket second ferromagnetic layer on top of the blanket tunnel barrier layer; patterning the blanket tunnel barrier layer and the blanket second ferromagnetic layer to form a tunnel barrier layer and a second ferromagnetic layer; and forming a top electrode on top of the second ferromagnetic layer.

In one embodiment, the method further includes forming a first dielectric liner lining the angled edge and the vertical edge of the first ferromagnetic layer.

In one embodiment, patterning the blanket tunnel barrier layer and the blanket second ferromagnetic layer includes etching a first portion of the blanket second ferromagnetic layer to form an upper portion of the second ferromagnetic layer, the upper portion of the second ferromagnetic layer having an angled edge; etching a second portion of the blanket second ferromagnetic layer to form a lower portion of the second ferromagnetic layer, the lower portion of the second ferromagnetic layer having a vertical edge; and etching the blanket tunnel barrier layer into the tunnel barrier layer, the tunnel barrier layer having a vertical edge that is vertically aligned with the vertical edge of the lower portion of the second ferromagnetic layer.

In another embodiment, the method further includes forming a second dielectric liner lining the angled edge and the vertical edge of the second ferromagnetic layer and lining the vertical edge of the tunnel barrier layer; and surrounding the second ferromagnetic layer and the tunnel barrier layer with a third dielectric layer.

In yet another embodiment, the method further includes surrounding the top electrode with a fourth dielectric layer, wherein the first dielectric layer, the second dielectric layer, the third dielectric layer and the fourth dielectric layer are made of a same dielectric material.

In one embodiment, the method further includes forming the bottom electrode on top of a conductive cap, the conductive cap being on top of a bottom contact; and forming a top contact on top of the top electrode.

In another embodiment, the bottom contact and the top contact are two neighboring metal layers of a back-end-of-line (BEOL) structure.

BRIEF DESCRIPTION OF THE DRAWINGS

The present invention will be understood and appreciated more fully from the following detailed description of embodiments of present invention, taken in conjunction with accompanying drawings of which.

Figure 1:
FIGS. 1-23 are demonstrative illustrations of cross-sectional views of a MRAM structure in a process of manufacturing thereof according to one embodiment of present invention.
Figure 1:
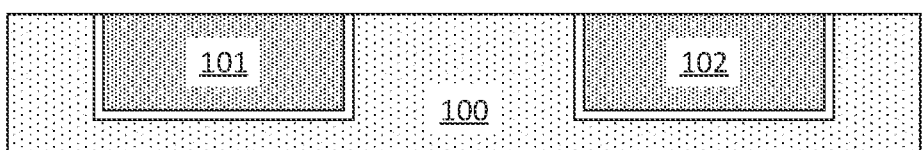

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction"

as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a MRAM structure in a step of manufacturing thereof according to one embodiment of present invention. The MRAM structure, for example MRAM structure 10, may include one or more magnetic tunnel junction (MTJ) stacks. For example, although two MTJ stacks and their forming are demonstratively illustrated in the current and following drawings and described below in more details, embodiments of present invention are not limited in this aspect and more or fewer number of MTJ stacks may be used as well. In one embodiment, the MTJ stacks may have a substantially cylindrical form or shape when being viewed from a top thereof, although other forms or shapes are possible and are fully contemplated here as well. It is to be understood here that cross-sectional views of the MRAM structure illustrated hereinafter may be views of cross-sections made substantially along a diameter of the MTJ stacks, in the case of the MTJ stacks having a substantially cylindrical form.

More particularly, embodiments of present invention provide forming a supporting structure such as forming bottom contacts 101 and 102 in a dielectric material layer 100. The bottom contacts 101 and 102 may be part of a metal level such as, for example, a metal level M2 or M3 and the dielectric material layer 100 may be an interlevel dielectric (ILD) layer in a back-end-of-line (BEOL) structure.

Alternatively, embodiments of present invention may provide receiving a supporting structure such as a dielectric material layer therewithin there may be formed or embedded one or more metal layers such as M2 or M3 that may serve as bottom contacts of one or more MTJ stacks to be formed there upon. For example, the supporting structure may be a dielectric material layer 100 that has bottom contacts 101 and 102 embedded therein.

In one embodiment, the bottom contacts 101 and 102 may include, or may be formed from, copper (Cu), cobalt (Co), tungsten (W), aluminum (Al), ruthenium (Ru) and other suitable conductive materials.

Figure 2:
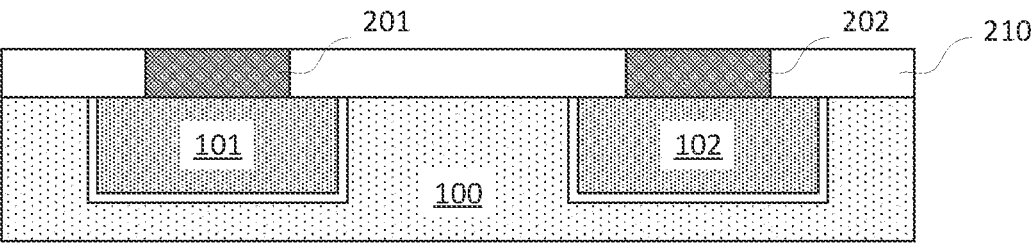

FIG. 2 is a demonstrative illustration of cross-sectional view of a MRAM structure in a step of manufacturing thereof, following the step illustrated in FIG. 1, according to one embodiment of present invention. More particularly, embodiments of present invention provide forming conductive caps 201 and 202 on top of the bottom contacts 101 and 102 respectively with the conductive caps 201 and 202 being embedded or surrounded by a dielectric material layer 210. In forming the above structure, one embodiment of present invention may include first depositing a layer of conductive material on top of the supporting structure, and then patterning the layer of conductive material into the conductive caps 201 and 202. After the patterning, a dielectric material may be deposited to surround the conductive caps 201 and 202 and the dielectric material may subsequently be planarized and/or polished through a chemical-mechanic-polishing (CMP) process to form the dielectric material layer 210. Another embodiment of present invention may include first depositing the dielectric material layer 210 on top of the supporting structure and then patterning the dielectric material layer 210 to create openings that are directly above and expose the bottom contacts 101 and 102. Subsequently the openings may be filled with a conductive material, which is followed by a CMP process, to form the conductive caps 201 and 202. In addition to the above embodiments, other known or future developed methods and/or processes may be used as well to form the conductive caps 201 and 202 and to surround the conductive caps 201 and 202 with the dielectric material layer 210.

Figure 3:
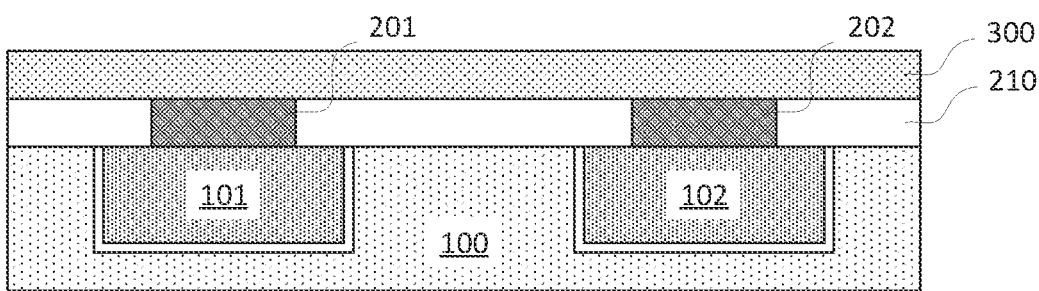

FIG. 3 is a demonstrative illustration of cross-sectional view of a MRAM structure in a step of manufacturing thereof, following the step illustrated in FIG. 2, according to one embodiment of present invention. More particularly, embodiments of present invention provide forming a bottom electrode layer 300 above the bottom contacts 101 and 102 and the dielectric material layer 100. More specifically, the bottom electrode layer 300 may be formed directly on top of the conductive caps 201 and 202 and the dielectric material layer 210. In one embodiment, the bottom electrode layer 300 may be a layer of tantalum-nitride (TaN) or titanium-nitride (TiN). In another embodiment, the bottom electrode layer 300 may be formed to have a thickness ranging from about 20 nm to about 100 nm, although other thicknesses are possible as well.

Figure 4:
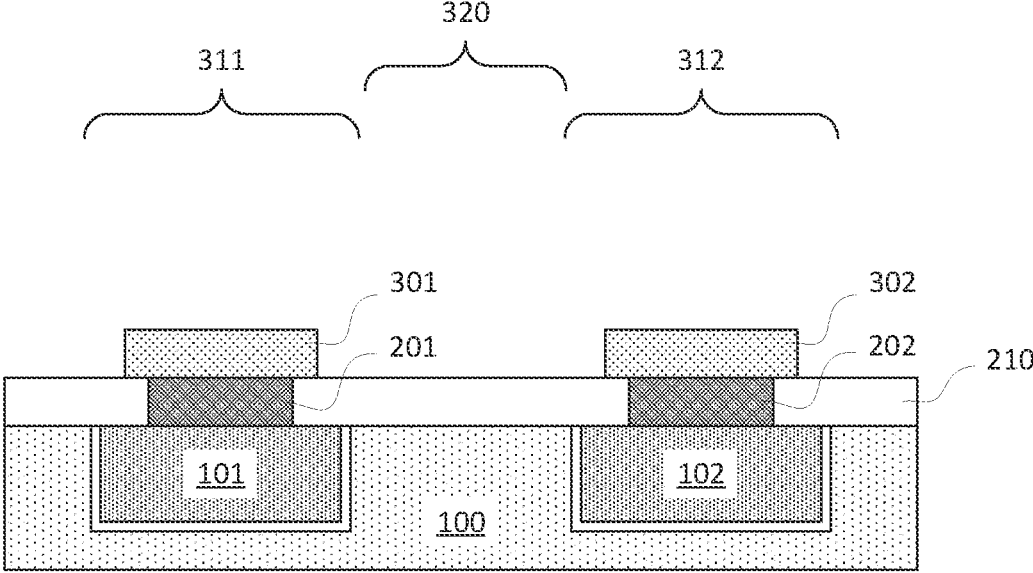

FIG. 4 is a demonstrative illustration of cross-sectional view of a MRAM structure in a step of manufacturing thereof, following the step illustrated in FIG. 3, according to one embodiment of present invention. More particularly, embodiments of present invention provide patterning the bottom electrode layer 300 into, for example, bottom electrodes 301 and 302, respectively, of a first MTJ stack 311 and a second MTJ stack 312 that are described below in more details. The bottom electrodes 301 and 302 may be formed on top of the conductive caps 201 and 202 through a patterning process. The patterning process may be, for example, a lithographic patterning and etching process that first produces a hard mask, and then uses that hard mask in etching the bottom electrode layer 300 thereby producing the bottom electrodes 301 and 302. The hard mask is then removed.

In one embodiment, the first and second MTJ stacks 311 and 312 may be separated by a distance 320 that may be about less than 80 nm such as 50 nm. This distance 320 in between the first and second MTJ stacks 311 and 312 is relatively small or narrow, when being compared with the height of the first and second MTJ stacks 311 and 312 that ranges typically from about 50 nm to about 300 nm as being described below in more details. The small separation between the first and second MTJ stacks 311 and 312 thus creates a narrow space, with an aspect ratio as high as 3, that in the current art needs to be filled out with a dielectric material. However, filling the narrow space of high aspect ratio may often lead to the creation of voids in the dielectric material. The voids, when being accidently filled with conductive materials in one or more subsequent processes, may ultimately lead to device short between, for example, the first and second MTJ stacks 311 and 312.

In recognizing this deficiency in the current art, embodiments of present invention provide a method of filling the space between the first and second MTJ stacks 311 and 312 with dielectric material through multiple deposition processes, with each time the space between the MTJ stacks 311 and 312 has a much smaller aspect ratio, thereby avoiding the difficulty in filling a space of high aspect ratio and the associated risk of creating voids and/or short.

Figure 5:
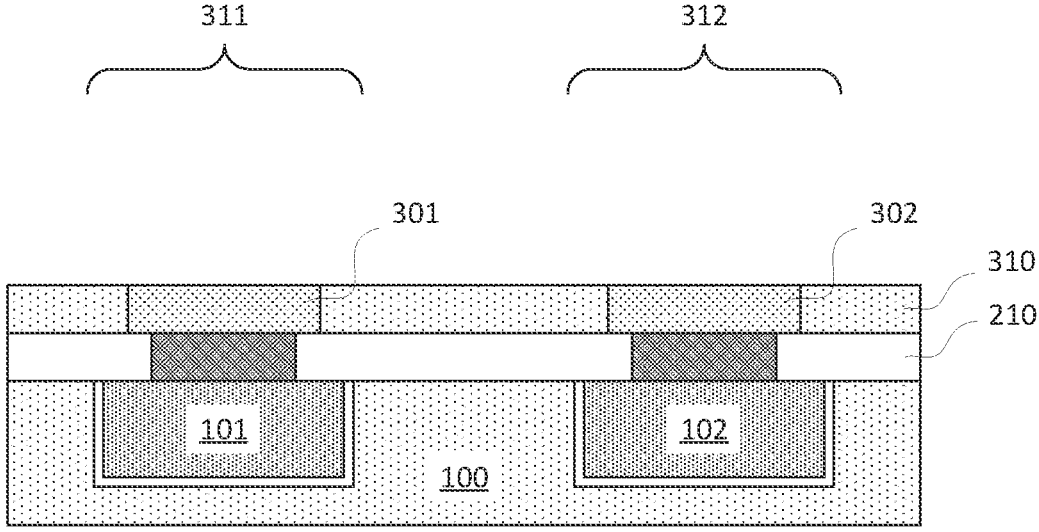

FIG. 5 is a demonstrative illustration of cross-sectional view of a MRAM structure in a step of manufacturing thereof, following the step illustrated in FIG. 4, according to one embodiment of present invention. More particularly, embodiments of present invention provide forming a first dielectric layer 310 to surround the bottom electrodes 301 and 302 by depositing a first dielectric material on top of the bottom electrodes 301 and 302 through, for example, a chemical-vapor-deposition (CVD) process, a physical-vapor-deposition (PVD), an atomic-layer-deposition (ALD) process, or other suitable means. After the deposition of the dielectric material, a top surface of the first dielectric layer 310 may be planarized such as by using a CMP process to be coplanar with that of the bottom electrodes 301 and 302.

Alternatively, the structure of the bottom electrodes 301 and 302 surrounded by a first dielectric layer 310 may be formed by first forming the first dielectric layer 310 on top of the conductive caps 201 and 202 and the dielectric material layer 210, creating openings in the first dielectric layer 310 that expose the conductive caps 201 and 202, and filling the openings with a conductive material, followed with a CMP process to remove excessive conductive material on top of the first dielectric layer 310, to form the bottom electrodes 301 and 302.

Figure 6:
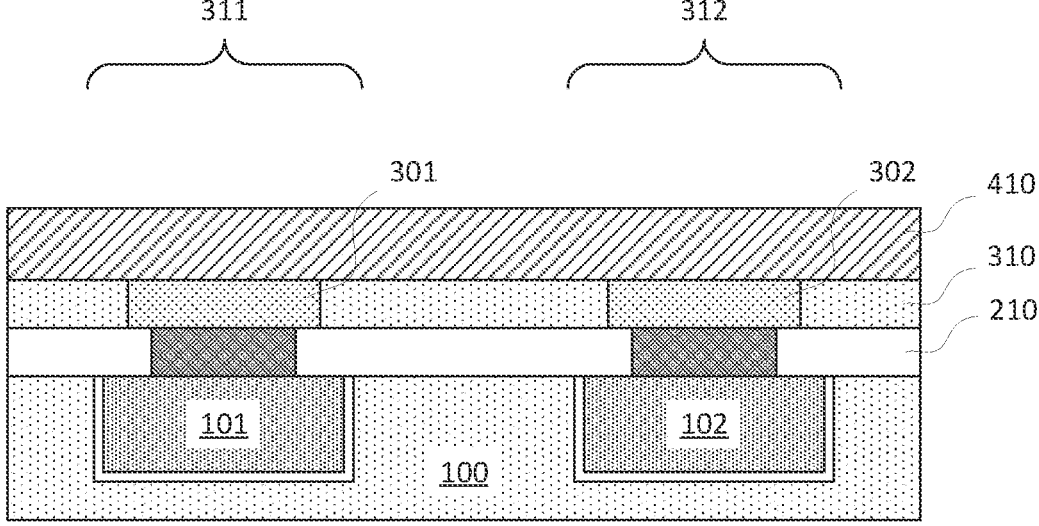

FIG. 6 is a demonstrative illustration of cross-sectional view of a MRAM structure in a step of manufacturing thereof, following the step illustrated in FIG. 5, according to one embodiment of present invention. More particularly, embodiments of present invention provide forming a blanket first ferromagnetic layer 410 on top of the bottom electrodes 301 and 302 and the first dielectric layer 310. The blanket first ferromagnetic layer 410 may be a layer of cobalt (Co), iron (Fe) and boron (B) based material (CoFeB) such as, for example, an alloy of Co, Fe, and B, although other types of ferromagnetic material such as an alloy of Co and Fe (CoFe) or an alloy of nickel (Ni) and Fe (NiFe) may be used as well. In one embodiment, the blanket first ferromagnetic layer 410 may also include a Co-based blanket synthetic anti-ferromagnetic layer as a portion thereof. The blanket first ferromagnetic layer 410 may be formed to have a thickness ranging from about 2 nm to about 30 nm.

Figure 7:
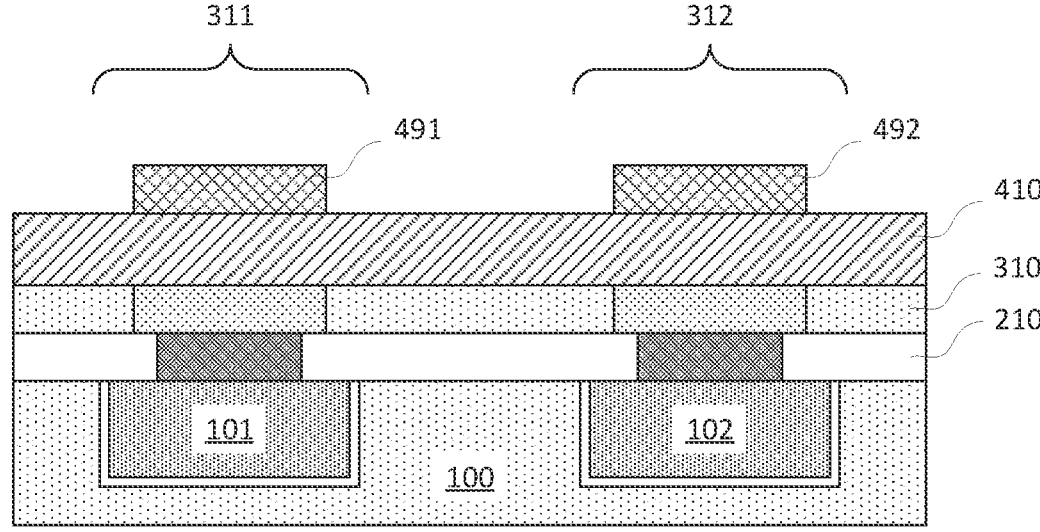

FIG. 7 is a demonstrative illustration of cross-sectional view of a MRAM structure in a step of manufacturing thereof, following the step illustrated in FIG. 6, according to one embodiment of present invention. More particularly, embodiments of present invention provide forming hard masks 491 and 492 on top of the blanket first ferromagnetic layer 410. The hard masks 491 and 492 may be, for example, silicon-nitride (SiN) and may be formed to be above and vertically substantially aligned with the bottom electrodes 301 and 302 respectively. In other words, the hard masks 491 and 492 may have a substantially same size as that of the bottom electrodes 301 and 302, although it is possible to make the hard masks 491 and 492 slightly larger or smaller than the bottom electrodes 301 and 302 as well. The hard masks 491 and 492 may be formed through a lithographic patterning and etching process and used in the patterning of the blanket first ferromagnetic layer 410.

Figure 8:
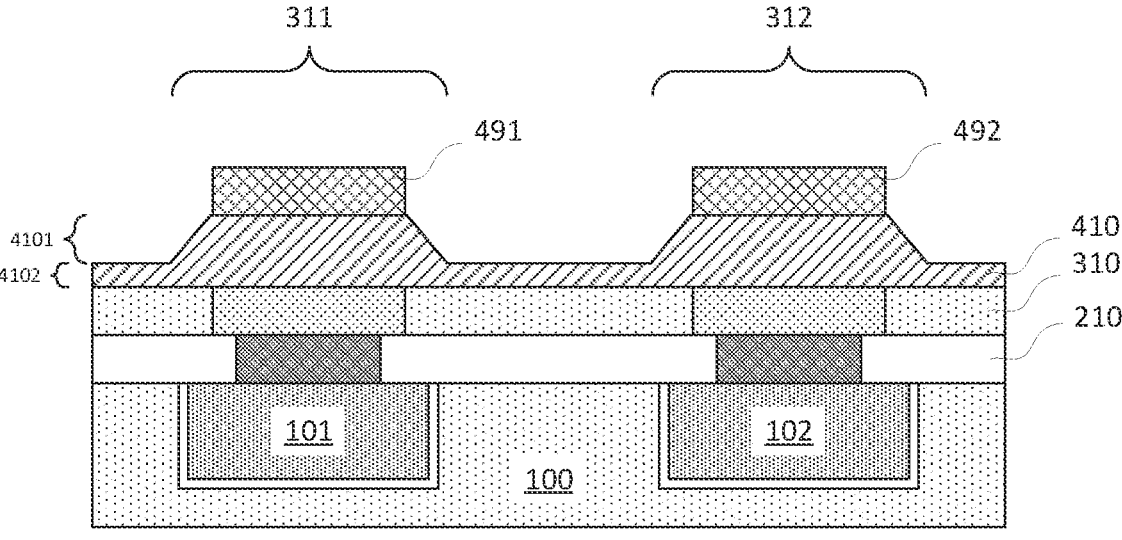

FIG. 8 is a demonstrative illustration of cross-sectional view of a MRAM structure in a step of manufacturing thereof, following the step illustrated in FIG. 7, according to one embodiment of present invention. More particularly, embodiments of present invention provide etching a first portion 4101 of the blanket first ferromagnetic layer 410, using the hard masks 491 and 492 as etch masks in a low-angle ion beam etching (IBE) process. The low-angle IBE process etches the first portion 4101 of the blanket first ferromagnetic layer 410 to result in trapezoidal-shaped portions of the first portion 4101 of the blanket first ferromagnetic layer 410 underneath the hard masks 491 and 492. Each of the trapezoidal-shaped portions of the first portion 4101 may have angled edge. The angled edge may form an angle, between about 120 degrees and about 150 degrees, with a top surface of the first portion 4101 of the blanket first ferromagnetic layer 410.

Figure 9:
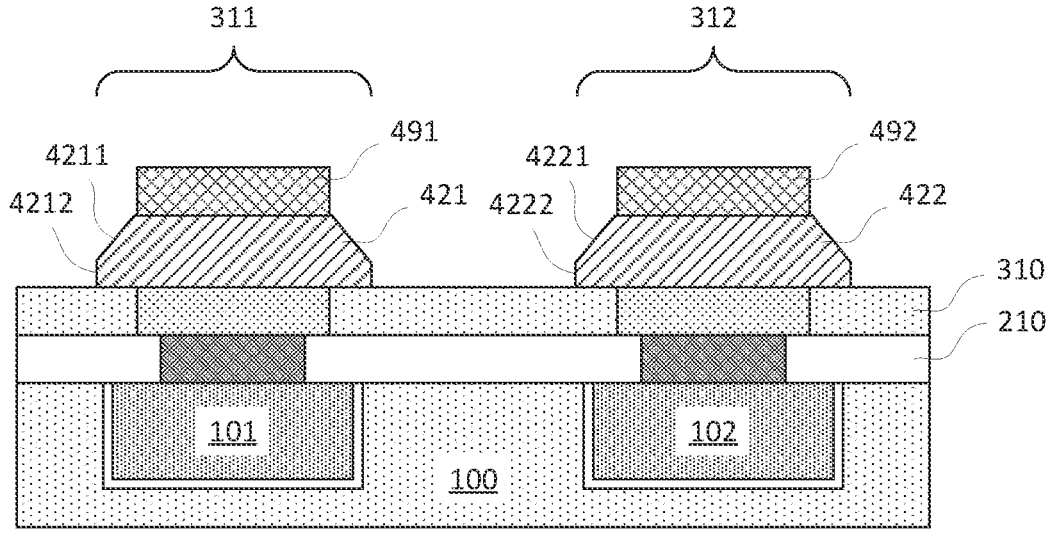

FIG. 9 is a demonstrative illustration of cross-sectional view of a MRAM structure in a step of manufacturing thereof, following the step illustrated in FIG. 8, according to one embodiment of present invention. More particularly, embodiments of present invention provide continuing the process of etching the blanket first ferromagnetic layer 410 by etching a second portion 4102 thereof in a 90-degree IBE process using the hard masks 491 and 492 as etch masks. The 90-degree IBE process may remove most of the second portion 4102 of the blanket first ferromagnetic layer 410, resulting in only portions of the second portion 4102 remaining directly underneath the trapezoidal-shaped portions of the first portion 4101. The portions of the second portion 4102 underneath the trapezoidal-shaped portions of the first portion 4101 have substantially vertical edges, which extend from the angled edges of the trapezoidal-shaped portions of the first portion 4101. In other words, the angled edges of the trapezoidal-shaped portions of the first portion 4101 intersect with the vertical edges of the portions of the second portion 4102 that are underneath the trapezoidal-shaped portions of the first portion 4101.

In other words, embodiments of present invention provide etching the blanket first ferromagnetic layer 410 into first ferromagnetic layers 421 and 422, respectively, of the first MTJ stack 311 and the second MTJ stack 312. The first ferromagnetic layers 421 and 422 have chamfered edges 4211 and 4221 and vertical edges 4212 and 4222 respectively. In one embodiment, the chamfered edges 4211 and 4221 may form an angle, measured against a top surface of the first ferromagnetic layers 421 and 422, between about 120 degrees and about 150 degrees and preferably form an angle of about 135 degrees.

By etching the blanket first ferromagnetic layer 410 into first ferromagnetic layers 421 and 422 with chamfered edges 4211 and 4221, embodiments of present invention ensure that the first ferromagnetic layers 421 and 422 have bottom surfaces that are larger than top surfaces of the bottom electrodes 301 and 302 to adequately cover the bottom electrodes 301 and 302. On the other hand, the chamfered or angled edges 4211 and 4221 of the first ferromagnetic layers 421 and 422 are followed by the vertical edges 4212 and 4222. In other words, the chamfered edges 4211 and 4221 intersect with the vertical edges 4212 and 4222 respectively. By doing so, the first ferromagnetic layers 421 and 422 may be able to avoid having sharp corners which is critical to ensure proper performance of the MRAM device. Otherwise, local magnetic anomalies at or near sharp corners would distort the local magnetic field and create non-uniformities in performance of the MTJ device.

In one embodiment, the first ferromagnetic layers 421 and 422 may be reference layers, when later formed second ferromagnetic layers 621 and 622 (see FIG. 15) are free layers, of the first MTJ stack 311 and the second MTJ stack 312 respectively. However, embodiments of present invention are not limited in this aspect and the first ferromagnetic layers 421 and 422 may be free layers, when the later formed second ferromagnetic layers 621 and 622 are reference layers, of the first MTJ stack 311 and the second MTJ stack 312 respectively.

Figure 10:
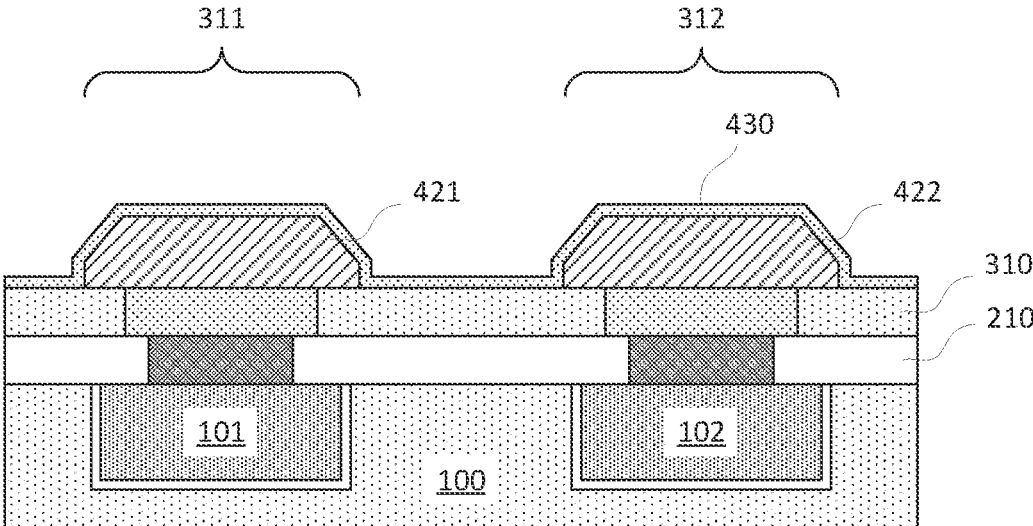

FIG. 10 is a demonstrative illustration of cross-sectional view of a MRAM structure in a step of manufacturing thereof, following the step illustrated in FIG. 9, according to one embodiment of present invention. More particularly, embodiments of present invention provide, after removing the hard masks 491 and 492, forming a first encapsulation layer 430 covering the first ferromagnetic layers 421 and 422. The first encapsulation layer 430 may be a conformal liner of dielectric material such as, for example, SiN or silicon-nitride-carbide (SiNC) and may be formed through a CVD, PVD, or ALD process. The first encapsulation layer 430 may have a thickness ranging from about 2 nm to about 20 nm.

Figure 11:
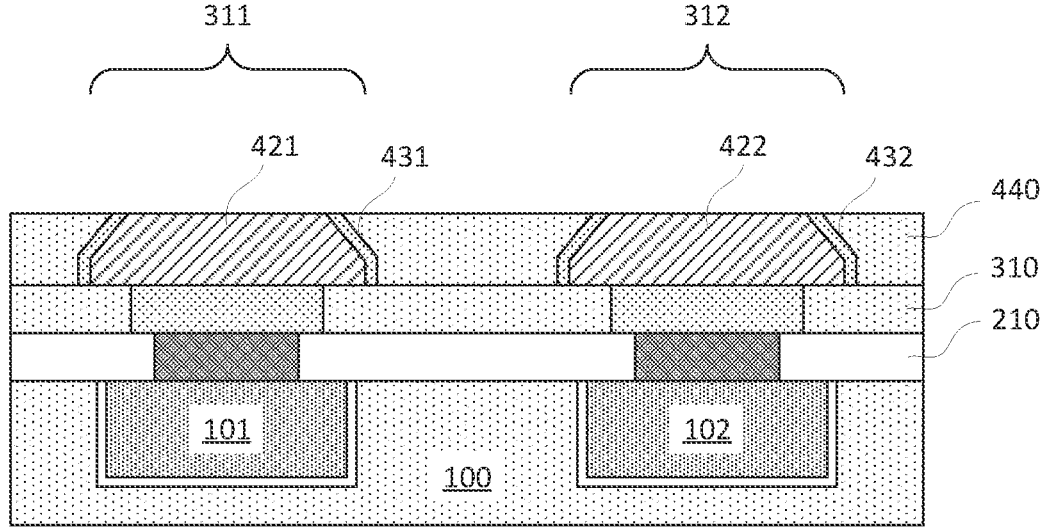

FIG. 11 is a demonstrative illustration of cross-sectional view of a MRAM structure in a step of manufacturing thereof, following the step illustrated in FIG. 10, according to one embodiment of present invention. More particularly, embodiments of present invention provide applying an anisotropic and/or directional etching process such as, for example, a reactive-ion-etching (RIE) process to remove portions of the first encapsulation layer 430 that are substantially horizontal, thereby resulting in first dielectric liners 431 and 432 surrounding the first ferromagnetic layers 421 and 422 respectively.

Embodiments of present invention further provide forming a second dielectric layer 440 surrounding the first ferromagnetic layers 421 and 422, for example, by depositing a second dielectric material to cover the first ferromagnetic layers 421 and 422 and then applying a CMP process to polish the deposited second dielectric material, thereby creating a top surface of the second dielectric layer 440 that is coplanar with top surfaces of the first ferromagnetic layers 421 and 422. Since a total height that the second dielectric layer 440 needs to fill between the first and second MTJ stacks 311 and 312 equals substantially to the height of the first ferromagnetic layers 421 and 422, the aspect ratio of the space between the first ferromagnetic layers 421 and 422 is small and there is little or no risk of creating void during the deposition process of the second dielectric layer 440. In one embodiment, the second dielectric material of the second dielectric layer 440 and the first dielectric material of the first dielectric layer 310 may be a same dielectric material.

Figure 12:
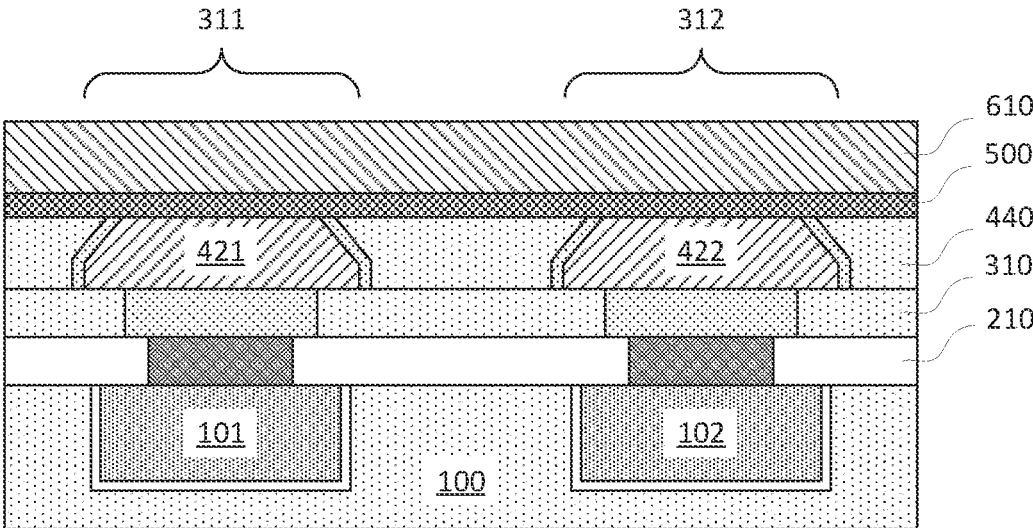

FIG. 12 is a demonstrative illustration of cross-sectional view of a MRAM structure in a step of manufacturing thereof, following the step illustrated in FIG. 11, according to one embodiment of present invention. More particularly, embodiments of present invention provide forming a blanket tunnel barrier layer 500 on top of the first ferromagnetic layers 421 and 422 and the surrounding second dielectric layer 440 and forming a blanket second ferromagnetic layer 610 on top of the blanket tunnel barrier layer 500.

In one embodiment, the blanket tunnel barrier layer 500 may be a layer of magnesium oxide (MgO) or other suitable materials including $Al_2O_3$, $TiO_2$ and may be formed to have a thickness ranging from about 0.6 nm to about 1.2 nm. The blanket second ferromagnetic layer 610 may be a blanket layer of alloy of Co, Fe, and B, an alloy of Co and Fe, or an alloy of Ni and Fe, similar to the blanket first ferromagnetic layer 410, and may be formed to have a thickness ranging from about 2 nm to about 30 nm. In one embodiment, the blanket second ferromagnetic layer 610 may also include a Co-based blanket synthetic anti-ferromagnetic layer as a portion thereof.

Figure 13:
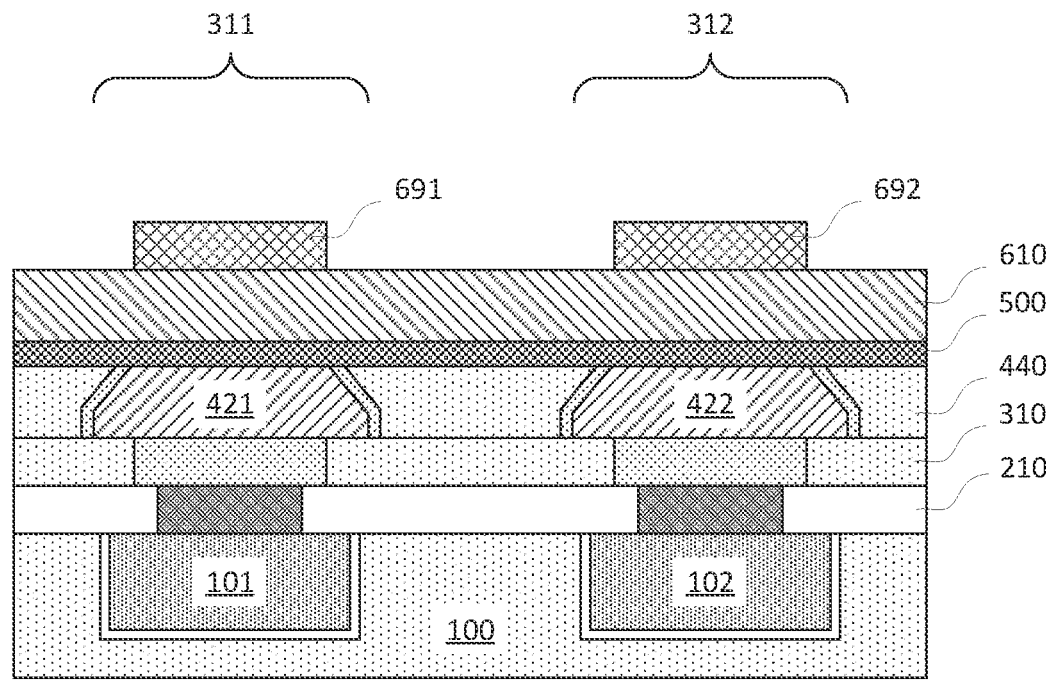

FIG. 13 is a demonstrative illustration of cross-sectional view of a MRAM structure in a step of manufacturing thereof, following the step illustrated in FIG. 12, according to one embodiment of present invention. More particularly, embodiments of present invention provide forming hard masks 691 and 692 on top of the blanket second ferromagnetic layer 610. The hard masks 691 and 692 may be, for example, SiN and may be formed to be above and vertically substantially aligned with the top surfaces of the first ferromagnetic layers 421 and 422 respectively. In other words, the hard masks 691 and 692 may have a substantially same size as the top surfaces of the first ferromagnetic layers 421 and 422, although it is possible to make the hard masks 691 and 692 slightly larger or smaller than that as well. The hard masks 691 and 692 may be formed through a lithographic patterning and etching process and used in the patterning of the blanket second ferromagnetic layer 610.

Figure 14:
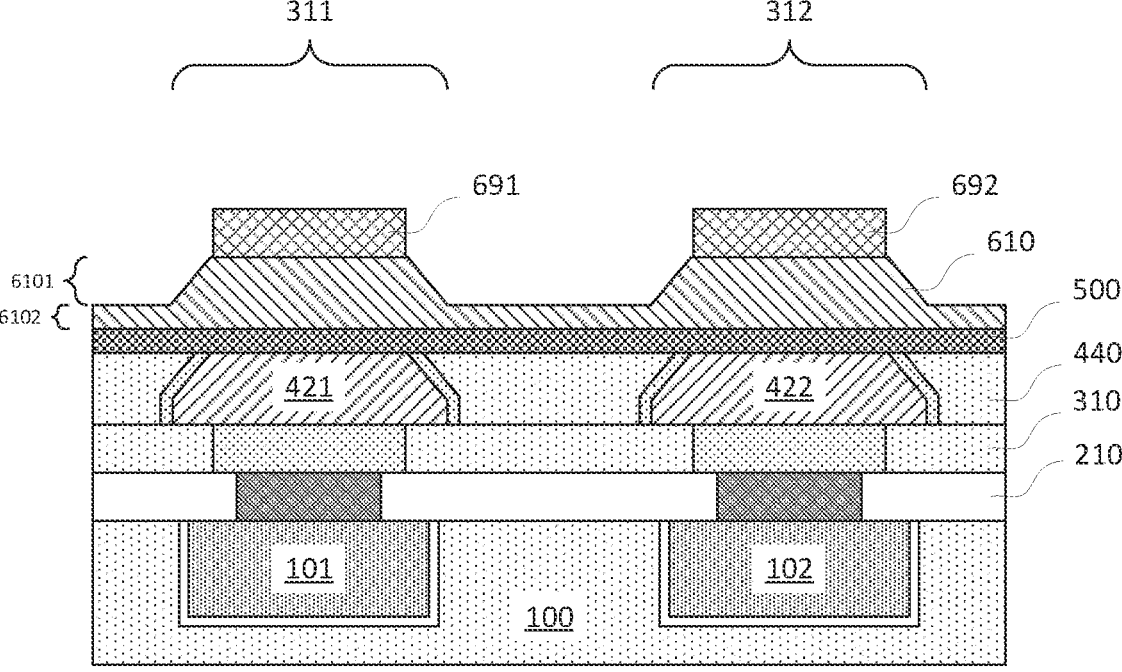

FIG. 14 is a demonstrative illustration of cross-sectional view of a MRAM structure in a step of manufacturing thereof, following the step illustrated in FIG. 13, according to one embodiment of present invention. More particularly, embodiments of present invention provide etching a first portion 6101 of the blanket second ferromagnetic layer 610, using the hard masks 691 and 692 as etch masks in a low-angle IBE process. The low-angle IBE process etches the first portion 6101 of the blanket second ferromagnetic layer 610 to result in trapezoidal-shaped portions of the first portion 6101 of the blanket second ferromagnetic layer 610 underneath the hard masks 691 and 692. Each of the trapezoidal-shaped portions of the first portion 6101 may have angled edge. The angled edge may form an angle, between about 120 degrees and about 150 degrees, with a top surface of the first portion 6101 of the blanket second ferromagnetic layer 610.

Figure 15:
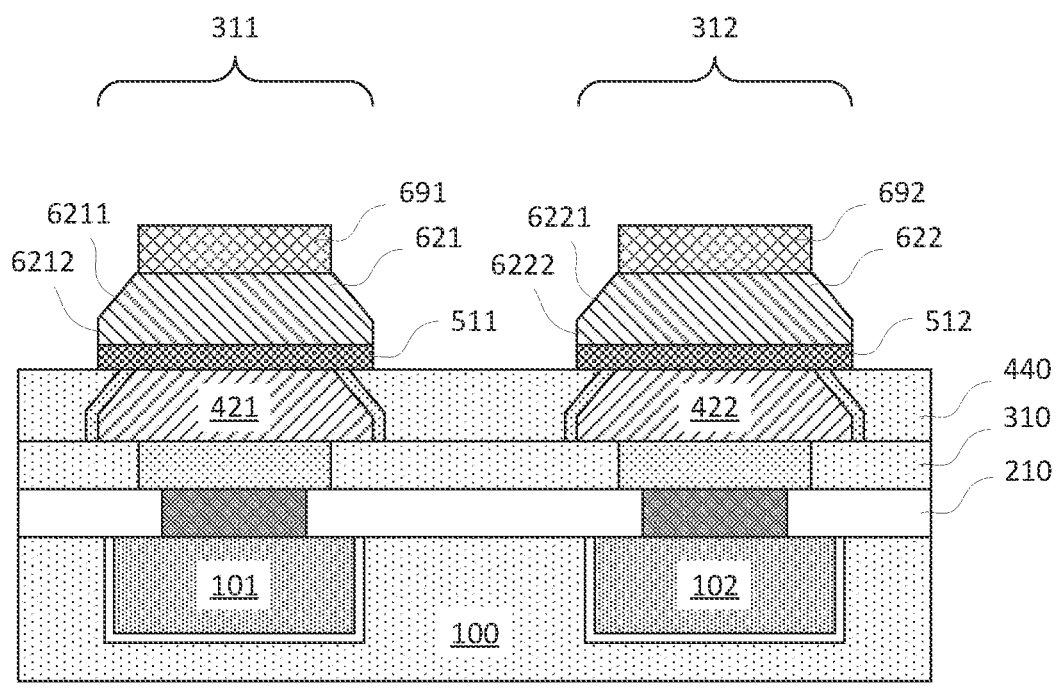

FIG. 15 is a demonstrative illustration of cross-sectional view of a MRAM structure in a step of manufacturing thereof, following the step illustrated in FIG. 14, according to one embodiment of present invention. More particularly, embodiments of present invention provide continuing the process of etching the blanket second ferromagnetic layer 610 by etching a second portion 6102 thereof in a 90-degree IBE process using the hard masks 691 and 692 as etch masks, and subsequently etching the underneath blanket tunnel barrier layer 500. The 90-degree IBE process may remove most of the second portion 6102 of the blanket second ferromagnetic layer 610, resulting in only portions of the second portion 6102 remaining directly underneath the trapezoidal-shaped portions of the first portion 6101. The portions of the second portion 6102 underneath the trapezoidal-shaped portions of the first portion 6101 have substantially vertical edges, which extend from or intersect with the angled edges of the trapezoidal-shaped portions of the first portion 6101.

The 90-degree IBE process further etches the blanket tunnel barrier layer 500 into tunnel barrier layers 511 and 512. The tunnel barrier layers 511 and 512 may have substantially vertical edges that are self-aligned with the vertical edges of the portions of the second portion 6102 underneath the trapezoidal-shaped portions of the first portion 6101 of the blanket second ferromagnetic layer 610.

In other words, embodiments of present invention provide etching the blanket second ferromagnetic layer 610 into second ferromagnetic layers 621 and 622, respectively, of the first MTJ stack 311 and the second MTJ stack 312. The second ferromagnetic layers 621 and 622 have chamfered edges 6211 and 6221 and vertical edges 6212 and 6222 respectively. In one embodiment, the chamfered edges 6211 and 6221 may form an angle, measured against a top surface of the second ferromagnetic layers 621 and 622, between about 120 degrees and about 150 degrees and may preferably form an angle of about 135 degrees.

By etching the blanket second ferromagnetic layer 610 into second ferromagnetic layers 621 and 622 with chamfered edges 6211 and 6221, embodiments of present invention ensure that the second ferromagnetic layers 621 and 622 (and the tunnel barrier layers 511 and 512) have bottom surfaces that are larger than the top surfaces of the first ferromagnetic layers 421 and 422 to adequately cover the first ferromagnetic layers 421 and 422. On the other hand, the chamfered or angled edges 6211 and 6221 of the second ferromagnetic layers 621 and 622 are followed by the vertical edges 6212 and 6222. In other words, the chamfered edges 6211 and 6221 intersect with the vertical edges 6212 and 6222 respectively. By doing so, the second ferromagnetic layers 621 and 622 may be able to avoid having sharp corners which, as being described above, is critical to ensure proper performance of the MRAM device.

In one embodiment, the second ferromagnetic layers 621 and 622 may be free layers, when the first ferromagnetic layers 421 and 422 are reference layers, of the first MTJ stack 311 and the second MTJ stack 312 respectively. However, embodiments of present invention are not limited in this aspect and the second ferromagnetic layers 621 and 622 may be reference layers, when the first ferromagnetic layers 421 and 422 are free layers, of the first MTJ stack 311 and the second MTJ stack 312 respectively.

Figure 16:
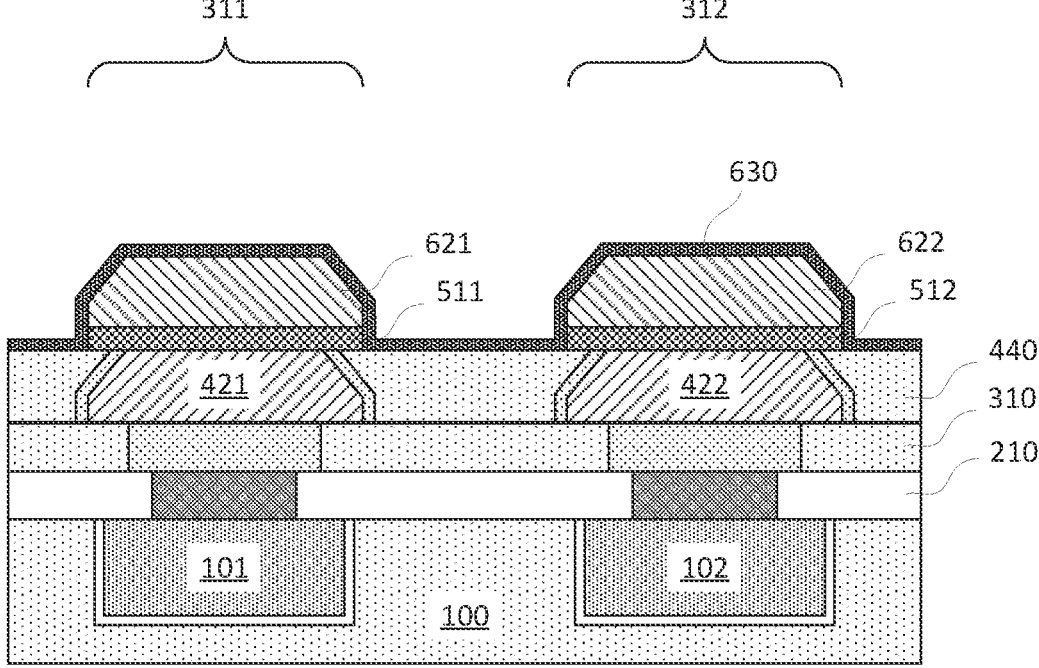

FIG. 16 is a demonstrative illustration of cross-sectional view of a MRAM structure in a step of manufacturing thereof, following the step illustrated in FIG. 15, according to one embodiment of present invention. More particularly, embodiments of present invention provide, after removing the hard masks 691 and 692, forming a second encapsulation layer 630 covering the second ferromagnetic layers 621 and 622. The second encapsulation layer 630 may be a conformal liner of dielectric material such as, for example, SiN or SiNC and may be formed through a CVD, PVD, or ALD process to have a thickness ranging from about 2 nm to about 20 nm. The second encapsulation layer 630 may be materially different from the first encapsulation layer 430. For example, in one embodiment, the first ferromagnetic layers 421 and 422 may be reference layers and the second ferromagnetic layers 621 and 622 may be free layers. In this case the second encapsulation layer 630 may be SiN and the first encapsulation layer 430 may be SiNC.

Figure 17:
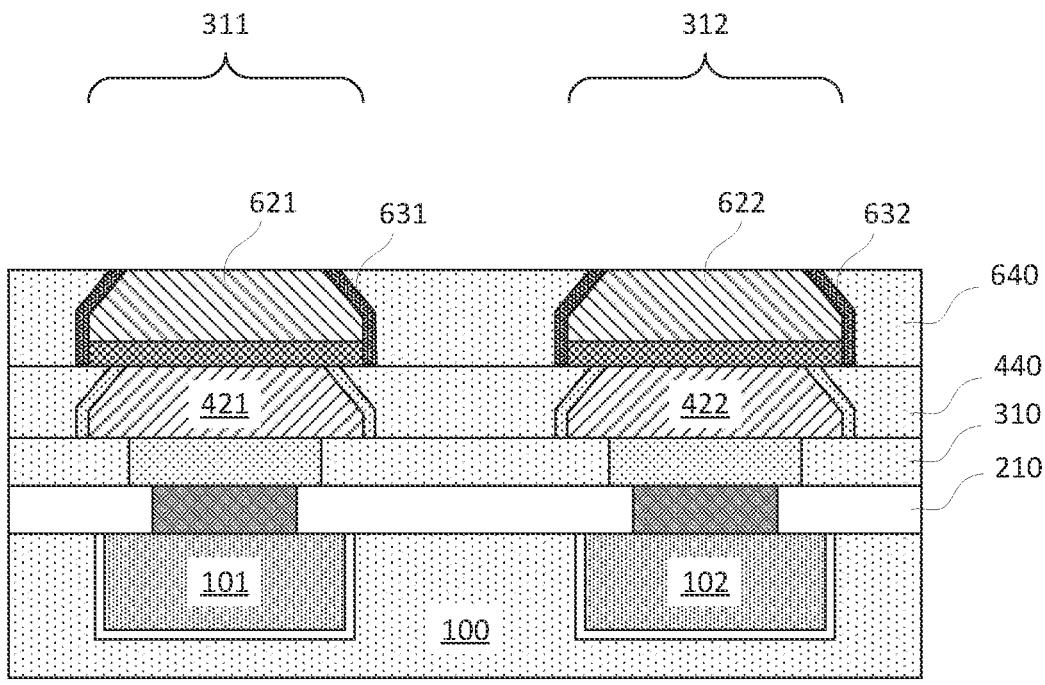

FIG. 17 is a demonstrative illustration of cross-sectional view of a MRAM structure in a step of manufacturing thereof, following the step illustrated in FIG. 16, according to one embodiment of present invention. More particularly, embodiments of present invention provide applying an anisotropic and/or directional etching process such as, for example, a RIE process to remove portions of the second encapsulation layer 630 that are substantially horizontal, thereby resulting in second dielectric liners 631 and 632 surrounding the second ferromagnetic layers 621 and 622 respectively.

Embodiments of present invention further provide forming a third dielectric layer 640 surrounding the second ferromagnetic layers 621 and 622, for example, by depositing a third dielectric material to cover the second ferromagnetic layers 621 and 622 and then applying a CMP process to polish the deposited third dielectric material, thereby creating a top surface of the third dielectric layer 640 that is coplanar with top surfaces of the second ferromagnetic layers 621 and 622. Since a total height that the third dielectric layer 640 needs to fill between the first and second MTJ stacks 311 and 312 equals substantially to a combined height of the second ferromagnetic layers 621 and 622 and the tunnel barrier layers 511 and 512, the aspect ratio of the space between the first and second MTJ stacks 311 and 312, in the region between the second ferromagnetic layers 621 and 622 and between the tunnel barrier layers 511 and 512, is small and there is little or no risk of creating void during the deposition process of the third dielectric layer 640. In one embodiment, the third dielectric material of the third dielectric layer 640, the second dielectric material of the second dielectric layer 440, and the first dielectric material of the first dielectric layer 310 may be a same dielectric material.

Figure 18:
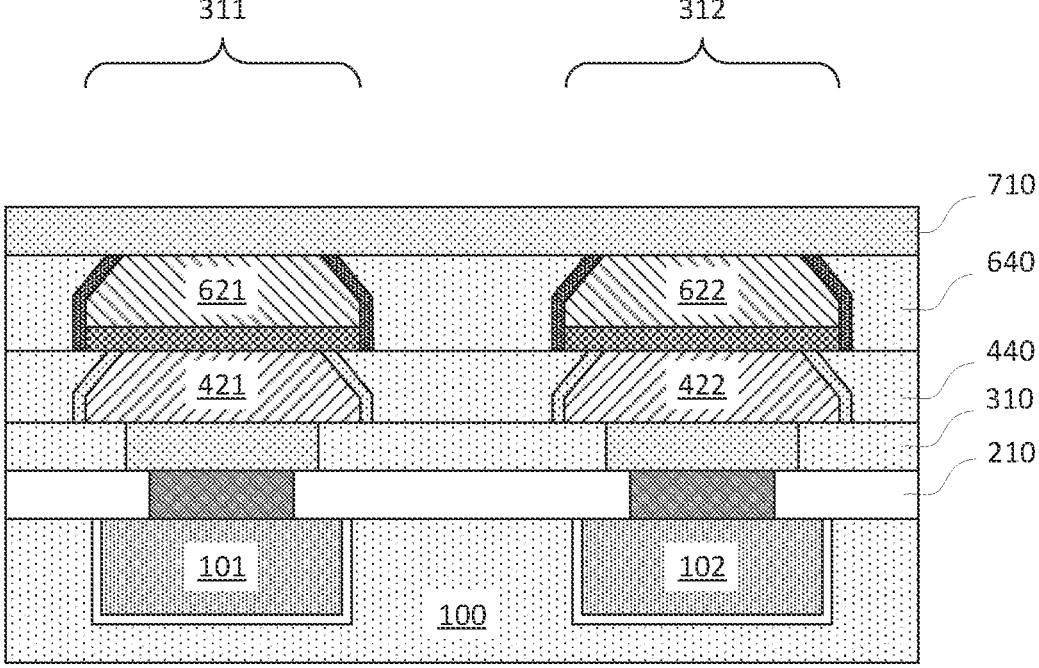

FIG. 18 is a demonstrative illustration of cross-sectional view of a MRAM structure in a step of manufacturing thereof, following the step illustrated in FIG. 17, according to one embodiment of present invention. More particularly, embodiments of present invention provide forming a top electrode layer 710 above the second ferromagnetic layers 621 and 622 and above the third dielectric layer 640. In one embodiment, the top electrode layer 710 may be a layer of tantalum-nitride (TaN) or titanium-nitride (TiN). The top electrode layer 710 may be formed to have a thickness ranging from about 20 nm to about 100 nm and may be formed similarly as the bottom electrode layer 300.

Figure 19:
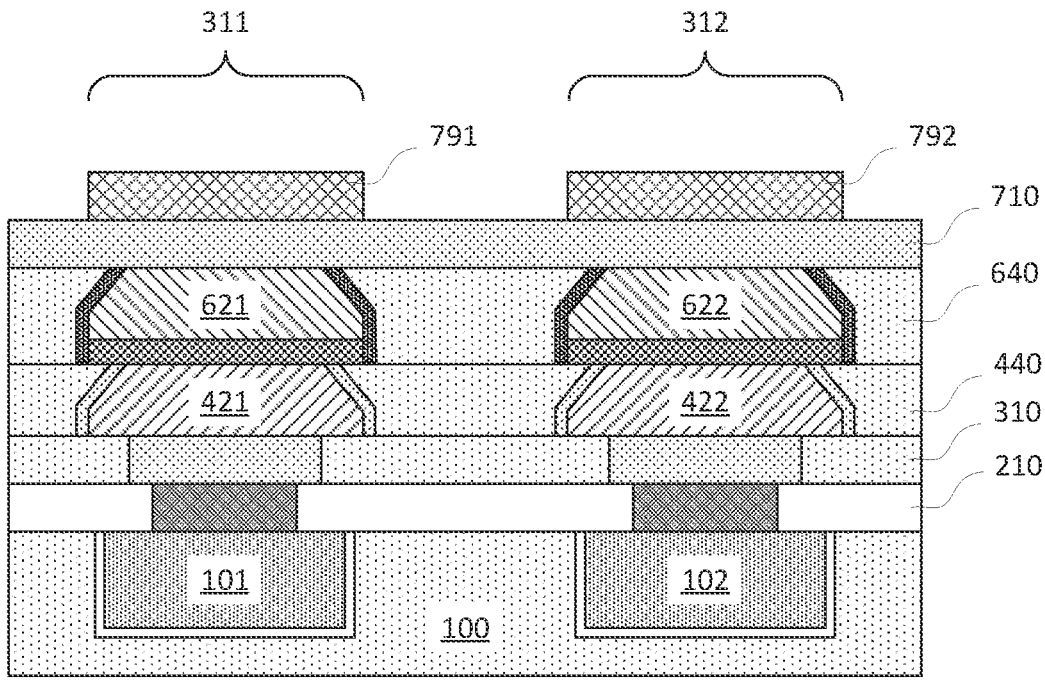

FIG. 19 is a demonstrative illustration of cross-sectional view of a MRAM structure in a step of manufacturing thereof, following the step illustrated in FIG. 18, according to one embodiment of present invention. More particularly, embodiments of present invention provide forming hard masks 791 and 792 on top of the top electrode layer 710. The hard masks 791 and 792 may be, for example, SiN and may be formed to be vertically substantially aligned with the second ferromagnetic layers 621 and 622 respectively. In other words, the hard masks 791 and 792 may be made to have a substantially same size as the top surfaces of the second ferromagnetic layers 621 and 622 or have a size that is between the sizes of the top and bottom surfaces of the second ferromagnetic layers 621 and 622. The hard masks 791 and 792 may be formed through a lithographic patterning and etching process and used in the patterning of the top electrode layer 710.

Figure 20:
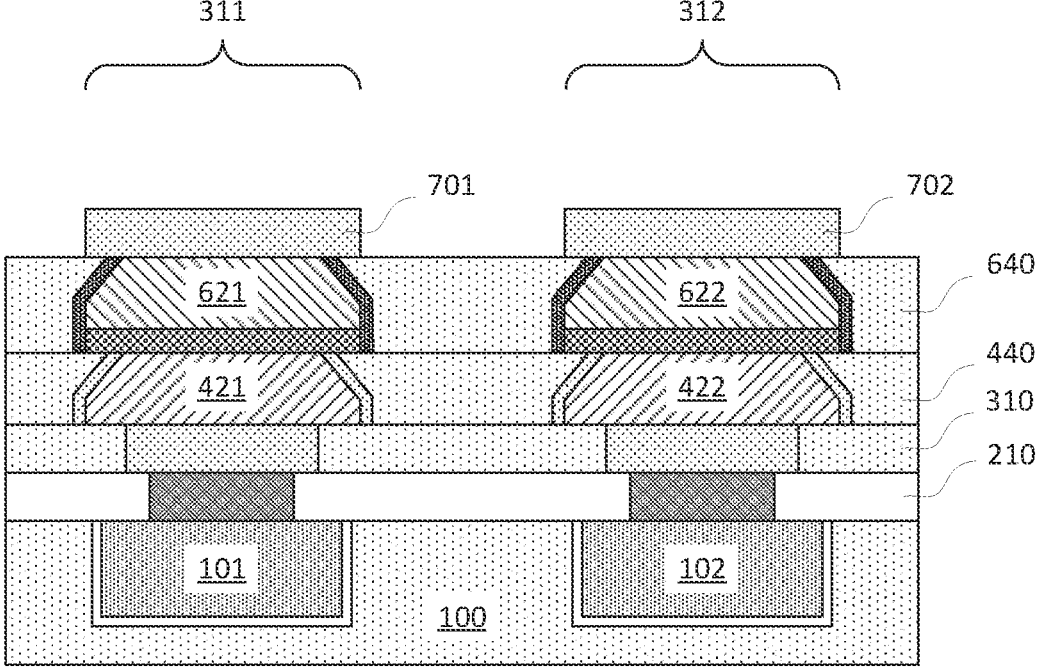

FIG. 20 is a demonstrative illustration of cross-sectional view of a MRAM structure in a step of manufacturing thereof, following the step illustrated in FIG. 19, according to one embodiment of present invention. More particularly, embodiments of present invention provide etching the top electrode layer 710 in an anisotropic and/or directional etching process such as an RIE process to form top electrodes 701 and 702. After the formation of the top electrodes 701 and 702, the hard masks 791 and 792 may be removed and/or lifted.

As is demonstratively illustrated in FIG. 20, the first MTJ stack 311 (and similarly the second MTJ stack 312) may include a stack of layers including the bottom electrode 301, the first ferromagnetic layer 421 (which may be a reference layer or a free layer), the tunnel barrier layer 511, the second ferromagnetic layer 621 (which may be a free layer or a reference layer), and the top electrode 701. The first MTJ stack 311 may have a combined height as high as about 260 nm. When the distance 320 between the first and second MTJ stacks 311 and 312 is about 80 nm or less, the space between the first and second MTJ stacks 311 and 312 may have an aspect ratio as high as 3 or more, which would be very difficult to fill with dielectric material without creating some voids.

By preferably choosing the hard mask sizes as described above and performing a low-angle IBE followed by a 90-degree IBE in the etching of the blanket first ferromagnetic layer 410, the blanket second ferromagnetic layer 610, and the top electrode layer 710, embodiments of present invention provide a method of forming the first and second MTJ stacks 311 and 312 that are able to maintain a width that is about the same size at that of the bottom electrodes.

Figure 21:
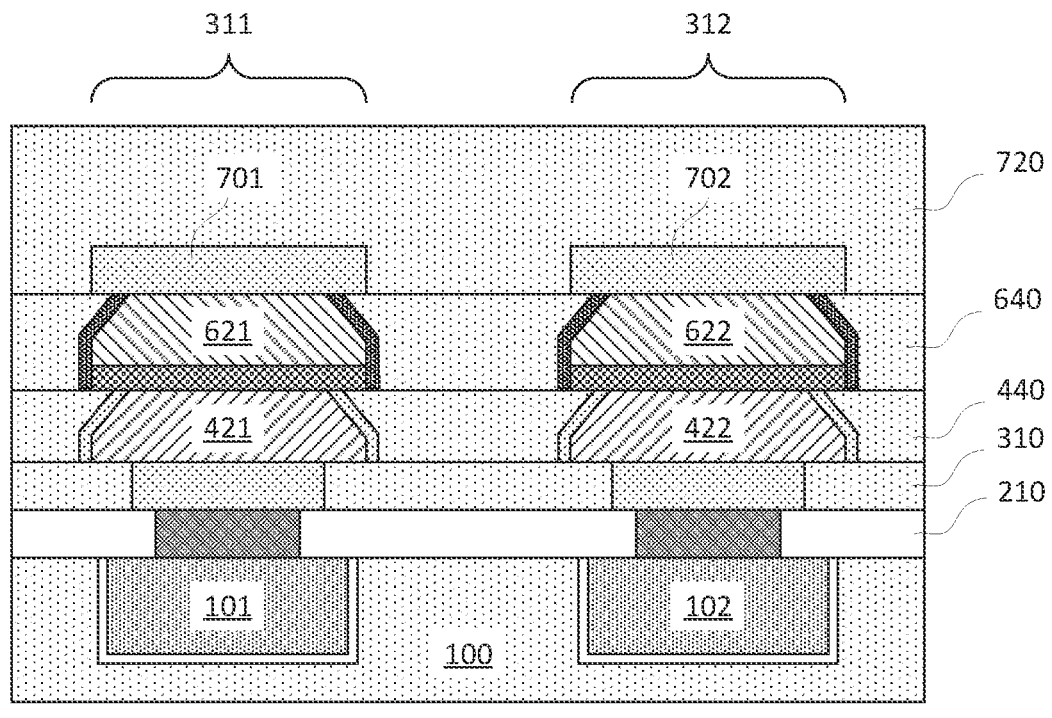

FIG. 21 is a demonstrative illustration of cross-sectional view of a MRAM structure in a step of manufacturing thereof, following the step illustrated in FIG. 20, according to one embodiment of present invention. More particularly, embodiments of present invention provide forming a fourth dielectric layer 720 of a fourth dielectric material above the first and second MTJ stacks 311 and 312 to cover the top electrodes 701 and 702. The fourth dielectric layer 720 may be formed through a deposition process such as, for example, a CVD, PVD or ALD process. In one embodiment, the fourth dielectric material of the fourth dielectric layer 720, the third dielectric material of the third dielectric layer 640, the second dielectric material of the second dielectric layer 440, and the first dielectric material of the first dielectric layer 310 may be a same dielectric material.

Figure 22:
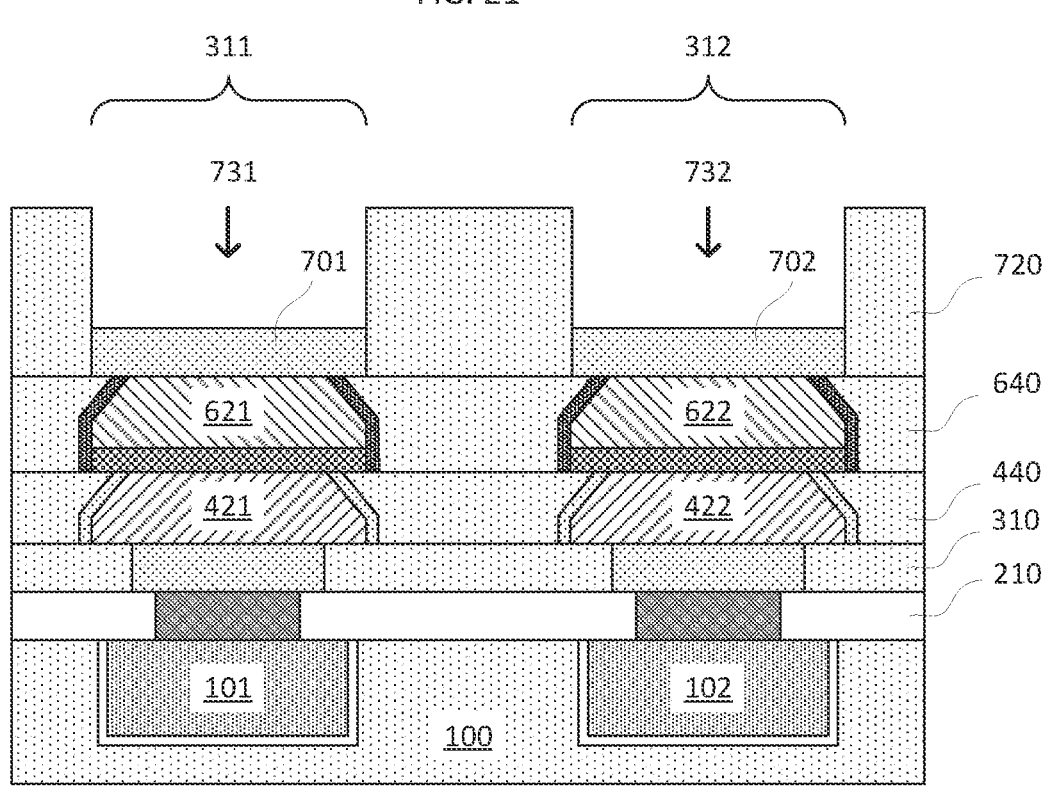

FIG. 22 is a demonstrative illustration of cross-sectional view of a MRAM structure in a step of manufacturing thereof, following the step illustrated in FIG. 21, according to one embodiment of present invention. More particularly, embodiments of present invention provide patterning the fourth dielectric layer 720 to create openings 731 and 732. In one embodiment, the openings 731 and 732 may be trench openings for forming top contacts. The top contacts may also be a metal level, such as a metal level M3 or M4, of a BEOL structure. The openings 731 and 732 may be substantially aligned with the top electrodes 701 and 702, thereby exposing the top electrodes 701 and 702.

Figure 23:
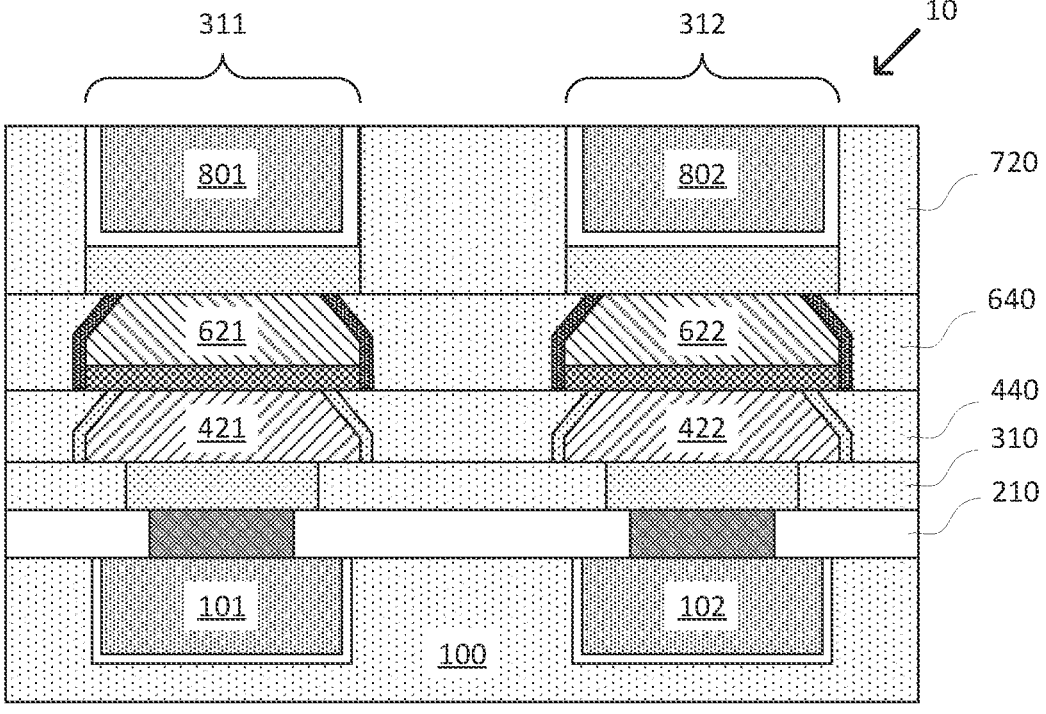

FIG. 23 is a demonstrative illustration of cross-sectional view of a MRAM structure in a step of manufacturing thereof, following the step illustrated in FIG. 22, according to one embodiment of present invention. More particularly, embodiments of present invention provide forming top contacts 801 and 802 in the openings 731 and 732. The top contacts 801 and 802 may be a metal level such as M3 or M4 and may be embedded and/or surrounded by the fourth dielectric layer 720. The top contacts 801 and 802 may be, for example, copper (Cu), cobalt (Co), tungsten (W), aluminum (Al), ruthenium (Ru) and other suitable conductive materials.

Figure 24:
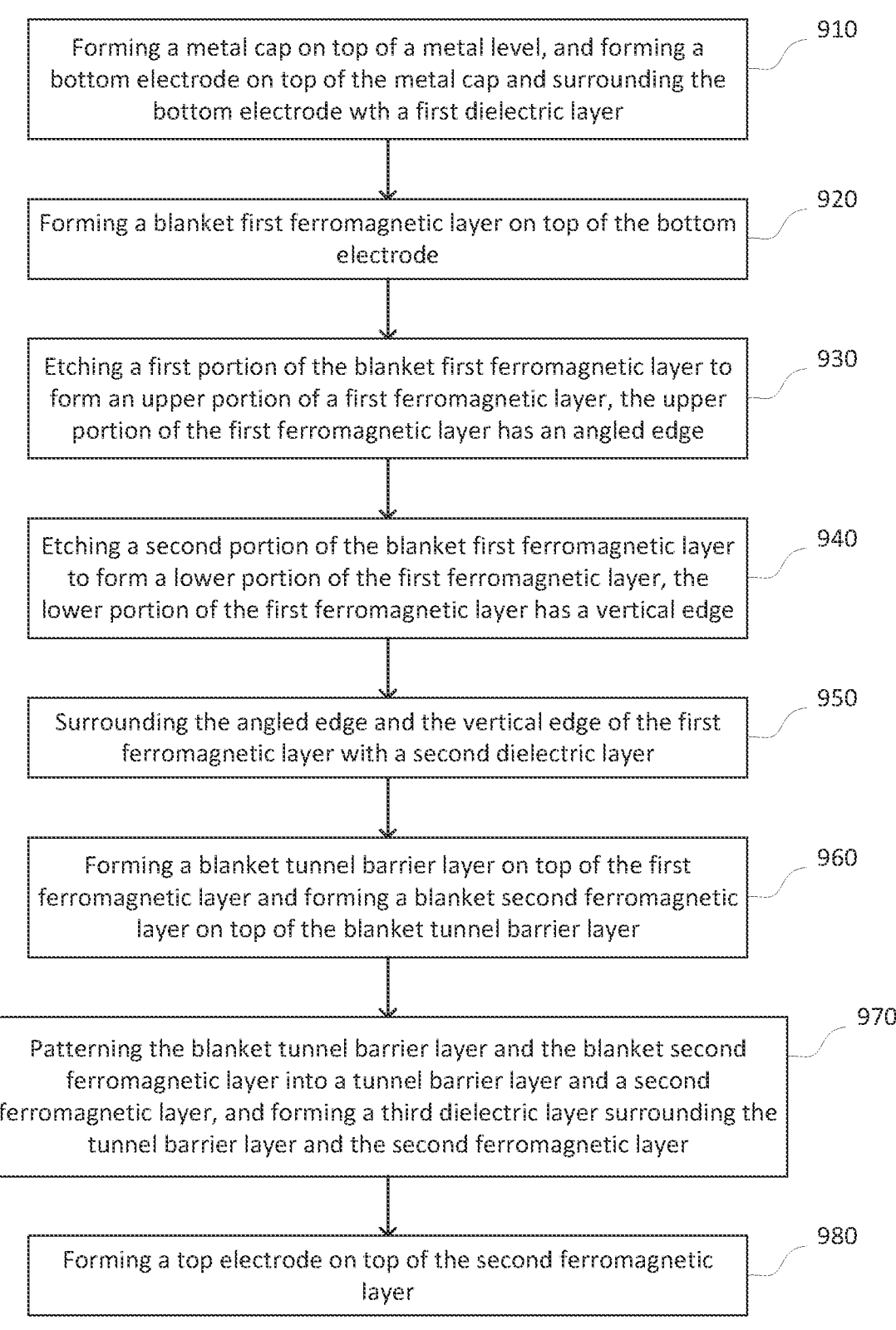
FIG. 24 is a demonstrative illustration of a flow-chart of a method of manufacturing a MRAM structure according to embodiments of present invention.

FIG. 24 is a demonstrative illustration of a flow-chart of a method of manufacturing a MRAM device according to embodiments of present invention. The method includes (910) forming a conductive cap such as a metal cap on top of a metal level which may serve as a bottom contact of the MTJ stack to be formed thereupon, forming a bottom electrode on top of the metal cap; and surrounding the bottom electrode with a first dielectric layer; (920) forming a blanket first ferromagnetic layer on top of the bottom electrode; (930) etching a first portion of the blanket first ferromagnetic layer to form an upper portion of a first ferromagnetic layer, the upper portion of the first ferromagnetic layer has an angled edge; (940) etching a second portion of the blanket first ferromagnetic layer to form a lower portion of the first ferromagnetic layer, the lower portion of the first ferromagnetic layer has a vertical edge; (950) surrounding the angled edge and the vertical edge of the first ferromagnetic layer with a second dielectric layer; (960) forming a blanket tunnel barrier on top of the first ferromagnetic layer and forming a blanket second ferromagnetic layer on top of the blanket tunnel barrier layer; (970) patterning the blanket tunnel barrier layer and the blanket second ferromagnetic layer into a tunnel barrier layer and a second ferromagnetic layer and the second ferromagnetic layer may have a chamfered edge as well, and forming a third dielectric layer surrounding the tunnel barrier layer and the second ferromagnetic layer; (980) forming a top electrode on top of the second ferromagnetic layer.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A MRAM structure comprising:
   a magnetic tunnel junction (MTJ) stack, the MTJ stack, vertically from a bottom to a top thereof, comprising a bottom electrode, a first ferromagnetic layer, a tunnel barrier layer, a second ferromagnetic layer, and a top electrode,
   wherein at least one of the first ferromagnetic layer and the second ferromagnetic layer has a chamfered edge and a vertical edge that intersects with the chamfered edge, and the chamfered edge of the at least one of the first ferromagnetic layer and the second ferromagnetic layer, the vertical edge of the at least one of the first ferromagnetic layer and the second ferromagnetic layer, and sidewall surfaces of the tunnel barrier layer are each covered by a dielectric liner.

2. The MRAM structure of claim 1, wherein the first ferromagnetic layer has the chamfered edge, and a bottom surface of the second ferromagnetic layer is larger than a top surface of the first ferromagnetic layer.

3. The MRAM structure of claim 2, wherein the first ferromagnetic layer has a vertical edge, and the chamfered edge intersects with the vertical edge.

4. The MRAM structure of claim 3, wherein the chamfered edge forms an angle, between about 120 degrees and about 150 degrees, with the top surface of the first ferromagnetic layer.

5. The MRAM structure of claim 1, wherein both the first ferromagnetic layer and the second ferromagnetic layer have chamfered edges intersecting with respective vertical edges.

6. The MRAM structure of claim 1, wherein the first ferromagnetic layer is a reference layer and the second ferromagnetic layer is a free layer.

7. The MRAM structure of claim 1, wherein the MTJ stack is a first MTJ stack, further comprising a second MTJ stack, and wherein the first and second MTJ stacks have a height of about 260 nm and are separated by a distance less than about 80 nm.

8. A MRAM structure comprising:
   a magnetic tunnel junction (MTJ) stack, the MTJ stack, vertically from a bottom to a top thereof, comprising a bottom electrode, a reference layer, a tunnel barrier layer, a free layer, and a top electrode,
   wherein the reference layer and the free layer have chamfered edges, the reference layer and the free layer have vertical edges, the chamfered edge of the reference layer intersects with the vertical edge of the reference layer, and the chamfered edge of the free layer intersects with the vertical edge of the free layer, the chamfered edge and the vertical edge of the reference layer is covered by a first dielectric liner, the chamfered edge and the vertical edge of the free layer is covered by a second dielectric liner, the first dielectric liner is materially different from the second dielectric liner.

9. The MRAM structure of claim 8, wherein a bottom surface of the free layer is larger than a top surface of the reference layer.

10. The MRAM structure of claim 8, wherein a bottom surface of the top electrode is larger than a top surface of the free layer, a bottom surface of the free layer is larger than a top surface of the reference layer, and a bottom surface of the reference layer is larger than a top surface of the bottom electrode.

11. The MRAM structure of claim 8, wherein the first dielectric liner comprises silicon-nitride-carbide (SINC) and the second dielectric liner comprises silicon-nitride (SiN).

* * * * *